(12) United States Patent
Lin et al.

(10) Patent No.: US 10,431,713 B2
(45) Date of Patent: Oct. 1, 2019

(54) NITRIDE UNDERLAYER AND FABRICATION METHOD THEREOF

(71) Applicant: XIAMEN SANAN OPTOELECTRONICS TECHNOLOGY CO., LTD., Xiamen (CN)

(72) Inventors: Wen-yu Lin, Xiamen (CN); Shengchang Chen, Xiamen (CN); Zhibai Zhong, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 15/859,493

(22) Filed: Dec. 30, 2017

(65) Prior Publication Data

US 2018/0122635 A1 May 3, 2018

Related U.S. Application Data

(63) Continuation of application No. PCT/CN2016/097869, filed on Sep. 2, 2016.

(30) Foreign Application Priority Data

Dec. 14, 2015 (CN) .......................... 2015 1 0921684

(51) Int. Cl.
*H01L 29/84* (2006.01)
*H01L 21/00* (2006.01)
(Continued)

(52) U.S. Cl.
CPC ........ *H01L 33/007* (2013.01); *C23C 14/0641* (2013.01); *C23C 14/34* (2013.01);
(Continued)

(58) Field of Classification Search
CPC ....................................................... H01L 33/12
(Continued)

(56) References Cited

U.S. PATENT DOCUMENTS

| 6,111,277 A * | 8/2000 | Ikeda | ..................... H01L 33/007 |
| | | | 257/103 |
| 6,528,394 B1 * | 3/2003 | Lee | .......................... C30B 25/02 |
| | | | 257/E21.113 |

(Continued)

FOREIGN PATENT DOCUMENTS

| CN | 101964382 A | 2/2011 |
| CN | 102194930 A | 9/2011 |

*Primary Examiner* — Calvin Lee
(74) *Attorney, Agent, or Firm* — Syncoda LLC; Feng Ma

(57) ABSTRACT

A nitride underlayer structure includes a sputtered AlN buffer layer with open band-shaped holes, thus providing a stress release path before the nitride film is grown over the buffer layer. A light-emitting diode with such nitride underlayer structure has improved lattice quality of the nitride underlayer structure and the problem of surface cracks is resolved. A fabrication method of the nitride underlayer includes providing a substrate and forming a band-shaped material layer over the substrate; sputtering an AlN material layer over the band-shaped material layer and the substrate to form a flat film; scanning back and forth from the substrate end with a laser beam to decompose the band-shaped material layer to form a sputtered AlN buffer layer with flat surface and band-shaped holes inside; and forming an $Al_xIn_{1-x-y}Ga_yN$ layer ($0 \le x \le 1$, $0 \le y \le 1$) over the sputtered AlN buffer layer.

9 Claims, 7 Drawing Sheets

(51) Int. Cl.
*H01L 33/00* (2010.01)
*H01L 33/12* (2010.01)
*C23C 14/06* (2006.01)
*C23C 14/58* (2006.01)
*C23C 16/02* (2006.01)
*C23C 28/04* (2006.01)
*H01L 21/02* (2006.01)
*C23C 14/34* (2006.01)
*C23C 16/30* (2006.01)
*H01L 33/32* (2010.01)

(52) U.S. Cl.
CPC ...... *C23C 14/5813* (2013.01); *C23C 14/5873* (2013.01); *C23C 16/0263* (2013.01); *C23C 16/0272* (2013.01); *C23C 16/303* (2013.01); *C23C 28/04* (2013.01); *H01L 21/0242* (2013.01); *H01L 21/0254* (2013.01); *H01L 21/02458* (2013.01); *H01L 21/02494* (2013.01); *H01L 21/02502* (2013.01); *H01L 21/02658* (2013.01); *H01L 33/12* (2013.01); *H01L 33/32* (2013.01)

(58) Field of Classification Search
USPC ......... 438/39, 48, 50, 94; 257/101, 254, 466
See application file for complete search history.

(56) References Cited

U.S. PATENT DOCUMENTS

| | | | |
|---|---|---|---|
| 9,293,646 B2* | 3/2016 | Takano | ................ H01L 33/007 257/76 |
| 2005/0167683 A1* | 8/2005 | Lee | ........................ C30B 25/02 257/81 |

* cited by examiner

NITRIDE UNDERLAYER AND FABRICATION METHOD THEREOF

CROSS-REFERENCE TO RELATED APPLICATIONS

The present application is a continuation of, and claims priority to, PCT/CN2016/097869 filed on Sep. 2, 2016, which claims priority to Chinese Patent Application No. 201510921684.3 filed on Dec. 14, 2015. The disclosures of these applications are hereby incorporated by reference in their entirety.

BACKGROUND

To develop deep-ultraviolet light-emitting diodes (LEDs), a AlN film with certain lattice quality can be obtained over a sapphire substrate through V/III multi-growth mode modifications, $NH_3$ pulsed flow methods, two-step methods, three-step methods, and low and high temperature alternation methods.

SUMMARY

The inventors of the present disclosure have recognized that how to grow crack-free AlN material with a high lattice quality is an important aspect of obtaining satisfactory deep-ultraviolet LEDs. More and more test results have shown that: by using sputtered AlN material over the sapphire substrate as the buffer layer for further growing nitride film, high-quality underlayer material can be obtained, and light output efficiency of the light-emitting diode can be greatly improved. For example, sputtering an AlN layer over the sapphire substrate as the buffer layer, and growing an AlN film over this sputtered AlN buffer layer via MOCVD, can greatly decrease diffraction half-wave width of XRD (102). However, surface of the sputtered AlN buffer layer is extremely flat, and cannot form discontinuous film surface to provide stress release path, which results in serious surface crack.

To solve the problems of serious surface cracks when a nitride film is grown over a sputtered AlN buffer layer, according to one aspect of the present disclosure, a nitride underlayer structure is provided. The nitride underlayer structure include a sputtered AlN layer with an open band-shaped hole as the buffer layer so as to provide a stress release path before the nitride film is grown over the buffer layer. As a result, lattice quality of the nitride underlayer structure is improved and surface cracks are avoided.

In some embodiments of the present disclosure, a nitride underlayer structure includes from bottom to up: a substrate, a sputtered AlN buffer layer and an $Al_xIn_{1-x-y}Ga_yN$ layer ($0 \leq x \leq 1$, $0 \leq y \leq 1$) gown via MOCVD, wherein, the sputtered AlN buffer layer has a flat surface, and a band-shaped hole inside for providing a stress release path.

In some embodiments, side wall of the AlN buffer layer and the hole are connected.

In some embodiments, thickness of the sputtered AlN layer is less than 1 μm.

In some embodiments, the hole is 0.1-0.5 μm deep and 100-500 μm wide.

According to another aspect of the present disclosure, a fabrication method of the nitride underlayer is provided, which includes: 1) providing a substrate, and forming a band-shaped material layer over the surface; 2) sputtering an AlN material layer over the band-shaped material layer and the substrate to form a flat film; 3) scanning back and forth from the substrate end with a laser beam to decompose the band-shaped material layer so as to form a sputtered AlN buffer layer with flat surface and a band-shaped hole inside; 4) forming an $Al_xIn_{1-x-y}Ga_yN$ layer ($0 \leq x \leq 1$, $0 \leq y \leq 1$) over the sputtered AlN buffer layer via MOCVD, wherein, relationship between the energy gap E1 of the band-shaped material layer, E2 of the laser beam and E3 of the AlN buffer layer is: E1<E2<E3.

Further, step 3) also includes: removing residues generated from decomposing the band-shaped material layer via wet etching to form a band-shaped hole connected to the side wall of the AlN buffer layer.

In some embodiments, the band-shaped material layer is GaN.

In some embodiments, in step 3), a laser beam with wavelength of 248 nm is adopted.

According to a third aspect of the present disclosure, a fabrication method of the nitride underlayer is provided, which includes: 1) providing a substrate, and sputtering an AlN material layer over the surface of the substrate to form a flat thin film; 2) scanning back and forth from the substrate end with a laser beam to decompose inside parts of the AlN material layer so as to form a sputtered AlN buffer layer with flat surface and a band-shaped hole inside; 3) forming an $Al_xIn_{1-x-y}Ga_yN$ layer ($0 \leq x \leq 1$, $0 \leq y \leq 1$) over the sputtered AlN buffer layer via MOCVD, wherein, relationship between the energy gap E2 of the laser beam and E3 of the AlN buffer layer is: E2>E3.

Further, step 2) also includes: removing residues generated from decomposing the AlN material layer via wet etching to form a band-shaped hole connected to the side wall of the AlN buffer layer.

In some embodiments, in step 2), a laser beam with wavelength of 193 nm is adopted.

The nitride underlayer structure can be applied in light-emitting diodes, in particular, deep-ultraviolet light-emitting diodes. A crack-free AlN underlayer with high lattice quality can be obtained through the aforesaid fabrication method. After growth of epitaxial material layers, a light-emitting diode with high light-emitting efficiency can be obtained.

Other features and advantages of this present disclosure will be described in detail in the following specification, and it is believed that such features and advantages will become more obvious in the specification or through implementations of this disclosure. The purposes and other advantages of the present disclosure can be realized and obtained in the structures specifically described in the specifications, claims and drawings.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

DETAILED DESCRIPTION

Prior to the detailed description of the present disclosure, it should be noted that similar components shall bear the same reference number throughout the description below.

Figure 1:
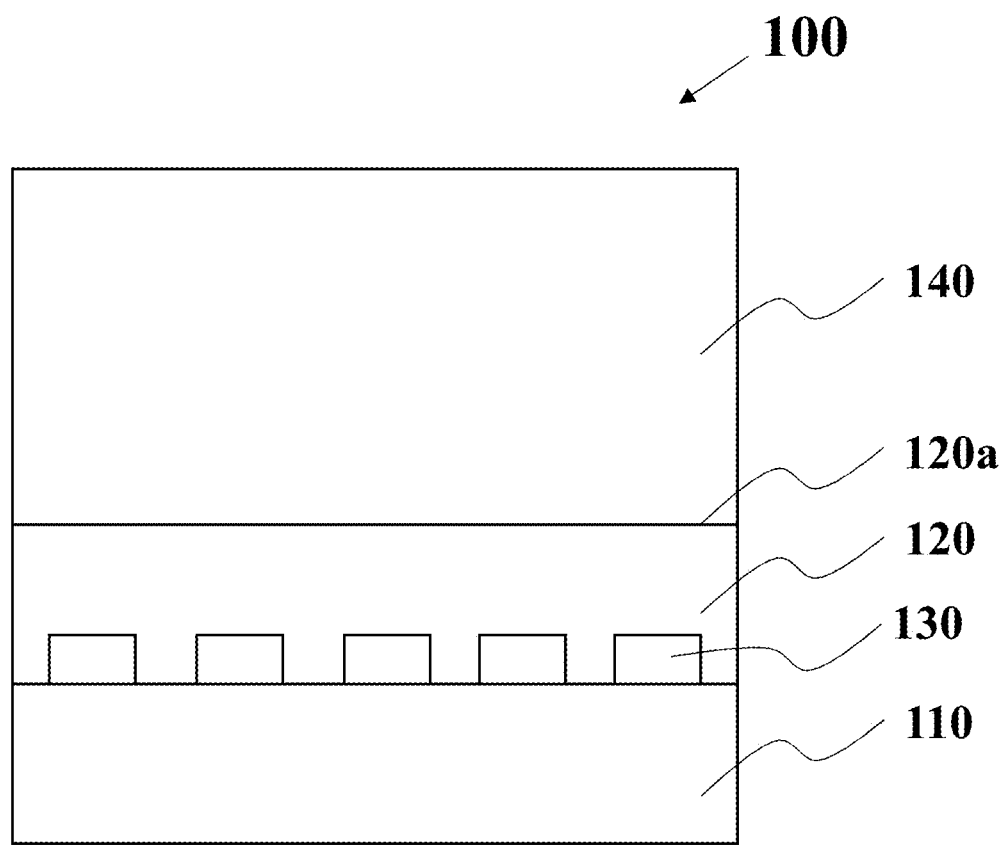
FIG. 1 illustrate a sectional view of a nitride underlayer structure according to some embodiments of the present disclosure.

With reference to FIG. 1, a preferred embodiment of the nitride underlayer 100, including a substrate 110, a sputtered AlN buffer layer 120 grown over the substrate 110 via PVD, and an $Al_xIn_{1-x-y}Ga_yN$ layer 140 ($0 \leq x \leq 1$, $0 \leq y \leq 1$) grown via MOCVD. The substrate 110 can be sapphire, AlN, GaN, Si, SiC and other materials, and the surface structure can be a plane structure. In this embodiment, a sapphire plain substrate is adopted. The sputtered AlN buffer layer 120 has a flat upper surface 120a and a band-shaped hole structure 130 inside, wherein, side walls of the band-shaped hole 130 and the sputtered AlN buffer layer 120 are connected for stress release. In the nitride underlayer structure of this embodiment, the sputtered AlN buffer layer can improve lattice quality of subsequent AlN and other nitride films, and an open band-shaped hole layer is introduced to release stress, thus solving surface crack of the nitride film.

Figure 2:
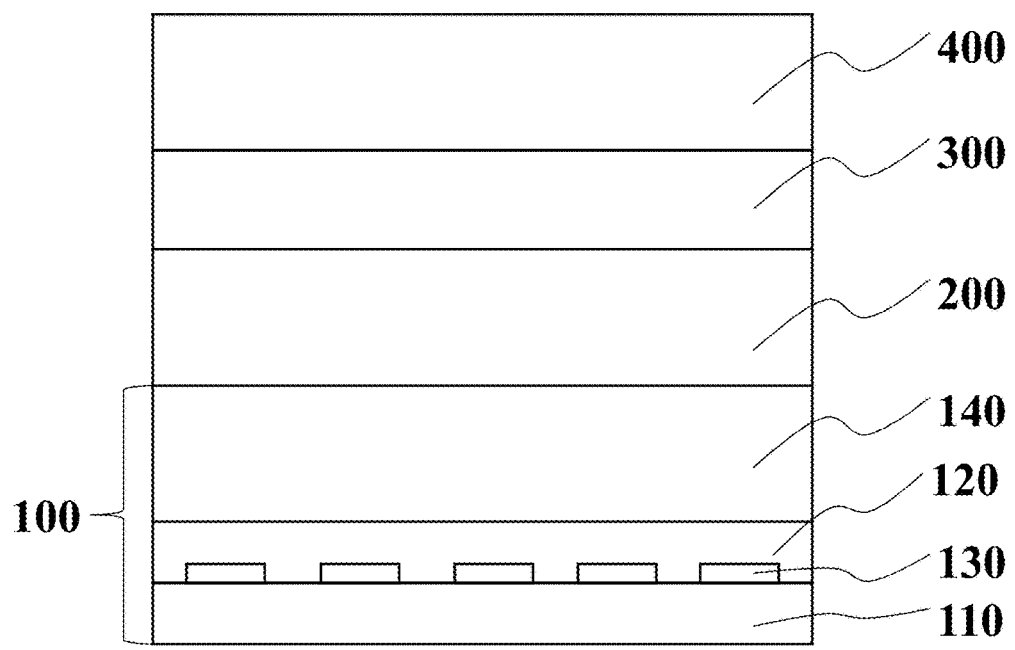
FIG. 2 illustrate a sectional view of a nitride light-emitting diode according to some embodiments of the present disclosure.

FIG. 2 illustrates an LED structure over the nitride underlayer structure 100. The LED structure at least includes an n-type semiconductor layer 200, an active layer 300 and a p-type semiconductor layer 400. In general, the AlN material layer can allow light emission as low as about 200 nm, especially suitable for growth of deep-ultraviolet LED. In this embodiment, the $Al_xIn_{1-x-y}Ga_yN$ layer 140 of the nitride underlayer structure 100 is AlN material. An n-type semiconductor layer 200, an active layer 300 and a p-type semiconductor layer 400 are formed over the AlN under layer 100 with AlGaN material, which can realize high-quality ultraviolet LED with wavelength of 210-365 nm.

Figure 3:
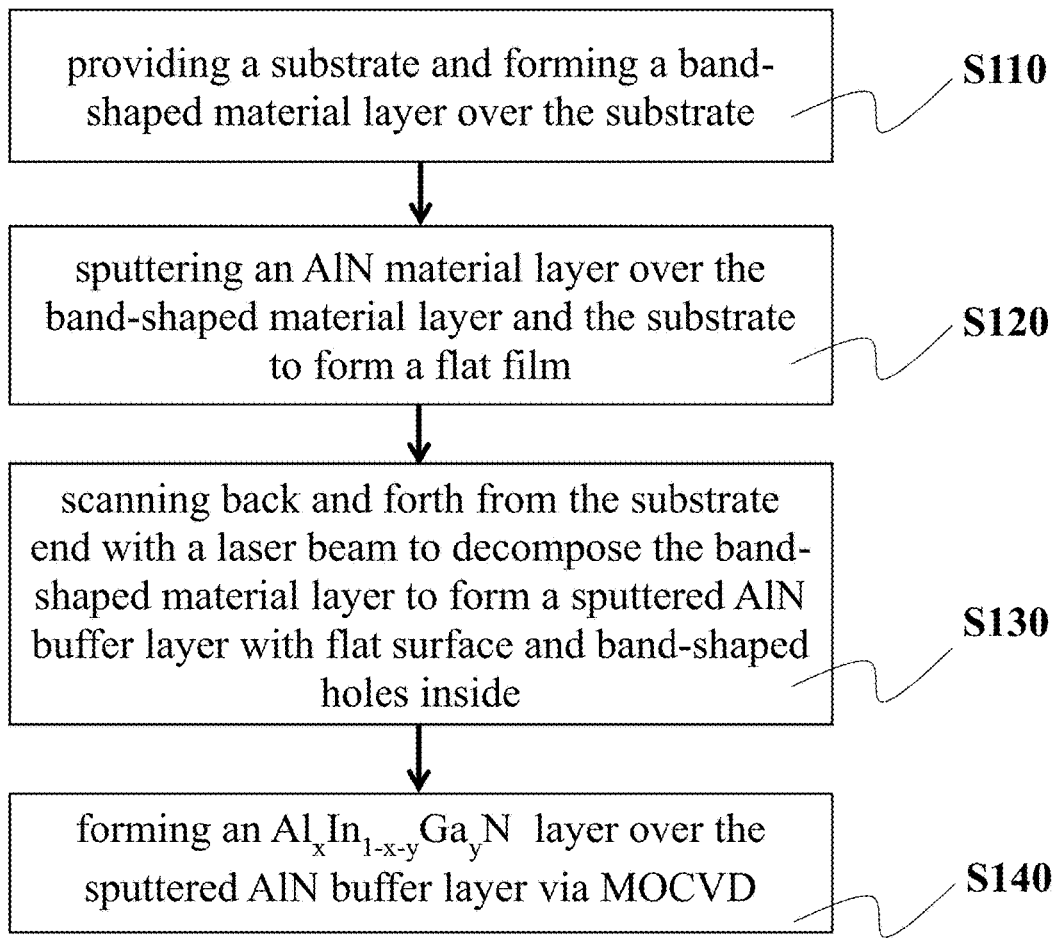
FIG. 3 shows a flow chart for a method of fabricating a nitride underlayer according to some embodiments of the present disclosure.

FIG. 3 shows a flowchart for fabricating a nitride underlayer according to the present disclosure, including steps S110: providing a substrate and forming a band-shaped material layer over the substrate; S120: sputtering an AlN material layer over the band-shaped material layer and the substrate to form a flat film; S0130: scanning back and forth from the substrate end with a laser beam to decompose the band-shaped material layer to form a sputtered AlN buffer layer with flat surface and band-shaped holes inside; S140: forming an $Al_xIn_{1-x-y}Ga_yN$ layer over the sputtered AlN buffer layer via MOCVD. Details will be described with reference to FIGS. 4-8.

Figure 4:
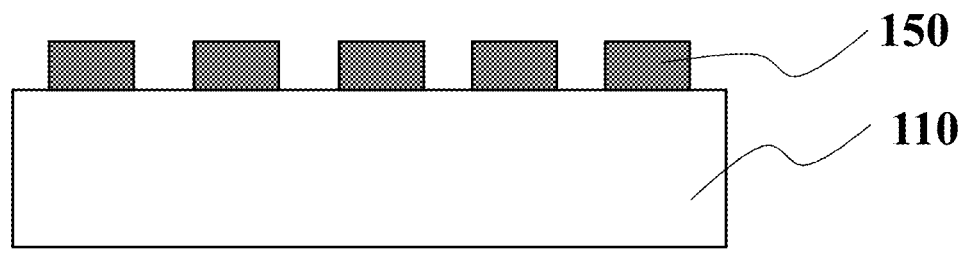
FIG. 4 illustrates a sectional view of a structure in a first step of fabricating a nitride underlayer according to the flow chart as shown in FIG. 3, including, for example: forming a band-shaped material layer with low energy gap material over the sapphire plain substrate.

With reference to FIG. 4, the process can include forming a band-shaped material layer 150 with a low-energy-gap material over the sapphire plain substrate 110. In this embodiment, a GaN material is selected. At first, deposit a GaN material layer over the sapphire plain substrate 110 via MOCVD or PVD, and then form a band-shaped structure via patterning.

Figure 5:
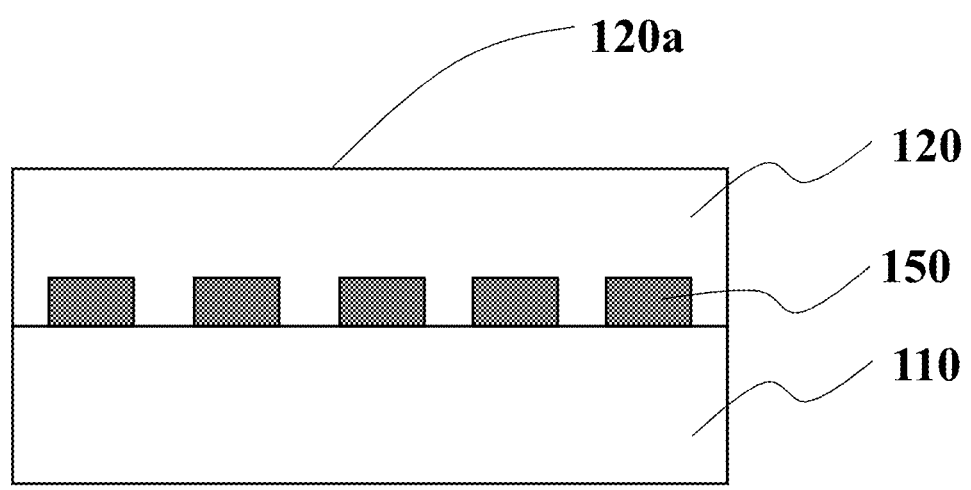
FIG. 5 illustrates a sectional view of a structure in a second step of fabricating a nitride underlayer, including, for example: sputter an AlN material layer over the surface of the band-shaped material layer and the substrate to form a flat thin film.

With reference to FIG. 5, sputter an AlN material layer over the surface of the band-shaped material layer 150 and the substrate 110 to form a flat thin film 120.

Figure 6:
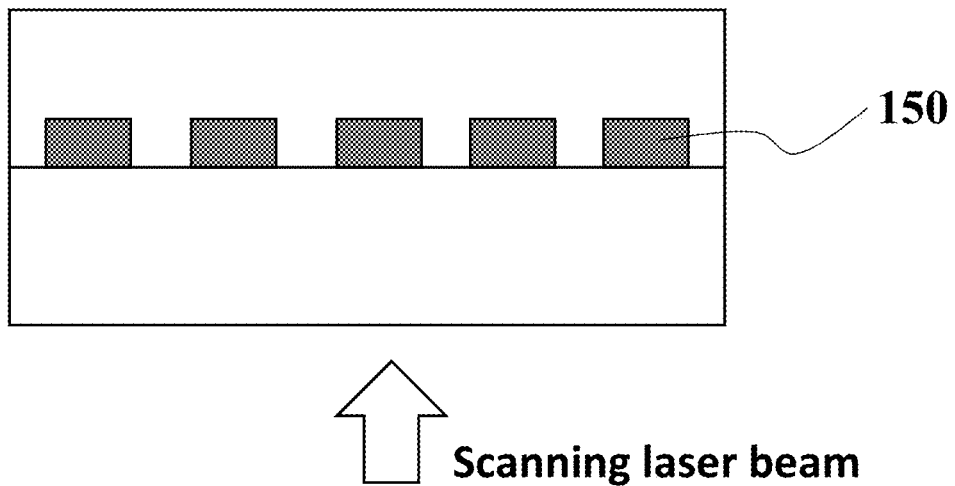
FIG. 6 illustrates a sectional view of a structure in a third step of fabricating a nitride underlayer, including, for example: emit laser beam from one end of the sapphire substrate, and scan back and forth to decompose the band-shaped material layer.
Figure 7:
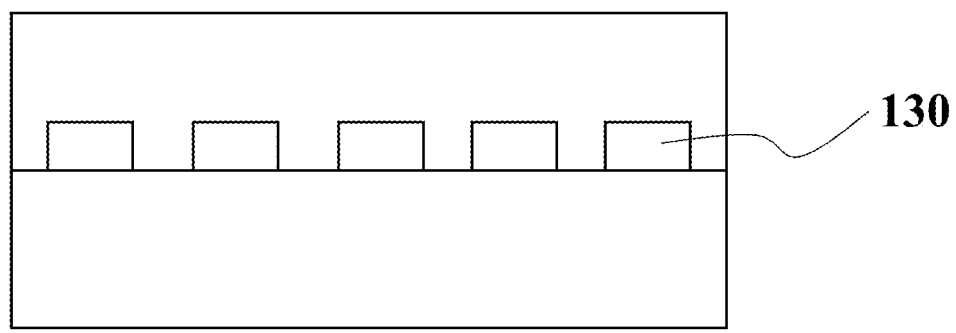
FIG. 7 illustrates a sectional view of a structure in a fourth step of fabricating a nitride underlayer, including, for example: remove the residues generated from decomposing the band-shaped material layer via wet etching to form a sputtered AlN buffer layer with an open band-shaped hole layer.

With references to FIGS. 6 and 7, emit laser beam from one end of the sapphire substrate 110, and scan back and forth to decompose the band-shaped material layer 150, then, remove the residues generated from decomposing the band-shaped material layer via wet etching to form a sputtered AlN buffer layer 120 with an open band-shaped hole layer 130. In this embodiment, a laser beam with 248 nm wavelength and 0.3 mm spot diameter is used for scanning. Relationship between the energy gap E1 of the band-shaped material layer 150 (energy gap: 3.4), E2 of the laser beam (energy gap: 5) and E3 of the AlN buffer layer 120 (energy gap: 6.1) is: E1<E2<E3; therefore, the band-shaped material layer 150 can be decomposed quickly to keep the sputtered AlN buffer layer 140 complete; then, remove the residual Ga metals after laser decomposition of the band-shaped GaN material layer to obtain a sputtered AlN buffer layer 120 with flat surface and holes inside, wherein, the band-shape hole is 0.1-0.5 μm deep and about 300 μm wide.

Figure 8:
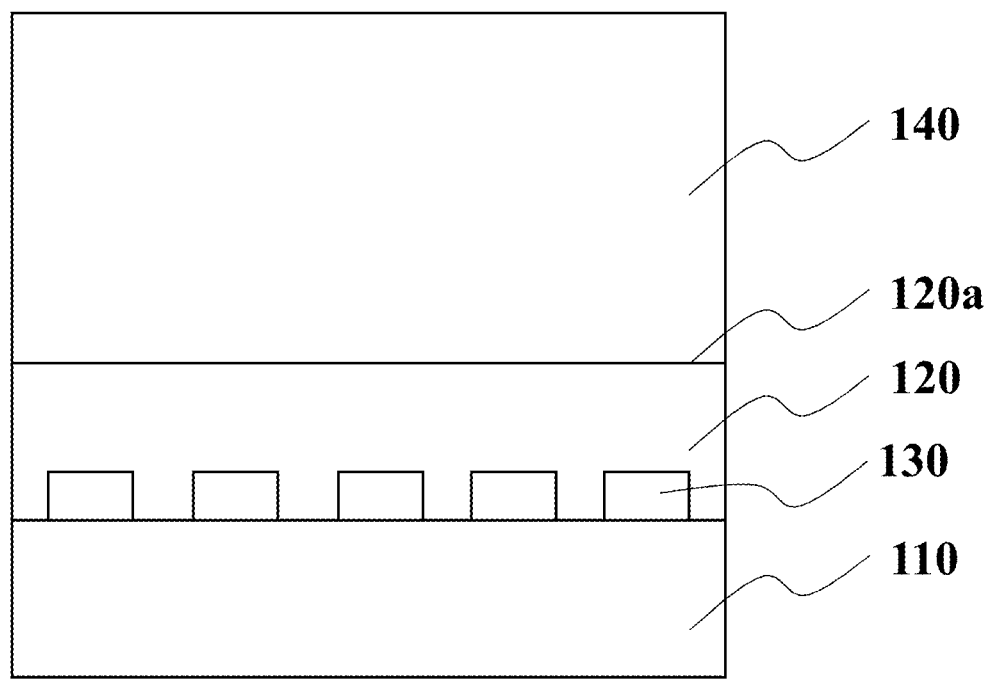
FIG. 8 illustrates a sectional view of a structure in a fifth step of fabricating a nitride underlayer, including, for example: grow an AlN layer over the sputtered AlN buffer layer via MOCVD.

With reference to FIG. 8, grow an AlN layer 140 over the sputtered AlN buffer layer 120 via MOCVD, which achieves good stress release through the embedded open band-shaped hole.

In general, a patterned substrate (PSS) or secondary epitaxy is required to import a hole layer in the nitride epitaxial film. In an AlN underlayer structure, due to a low epitaxial lateral growth rate of AlN, after formation, the hole continues to grow to make the film flat; therefore, a 5-10 μm AlN epitaxial layer must be grown. In this embodiment, at first, form a band-shaped material layer 150 with low energy gap between the substrate 110 and the sputtered AlN buffer layer 120; then, scan from one side of the substrate to decompose the low energy gap material layer 150, which maintains flat characteristics of the sputtered AlN buffer layer surface. Meanwhile, an open hole layer is formed inside for stress release; subsequently, a crack-free AlN film can be directly formed over the sputtered AlN buffer layer via MOCVD directly to avoid growth of thick AlN and secondary growth.

Figure 9:
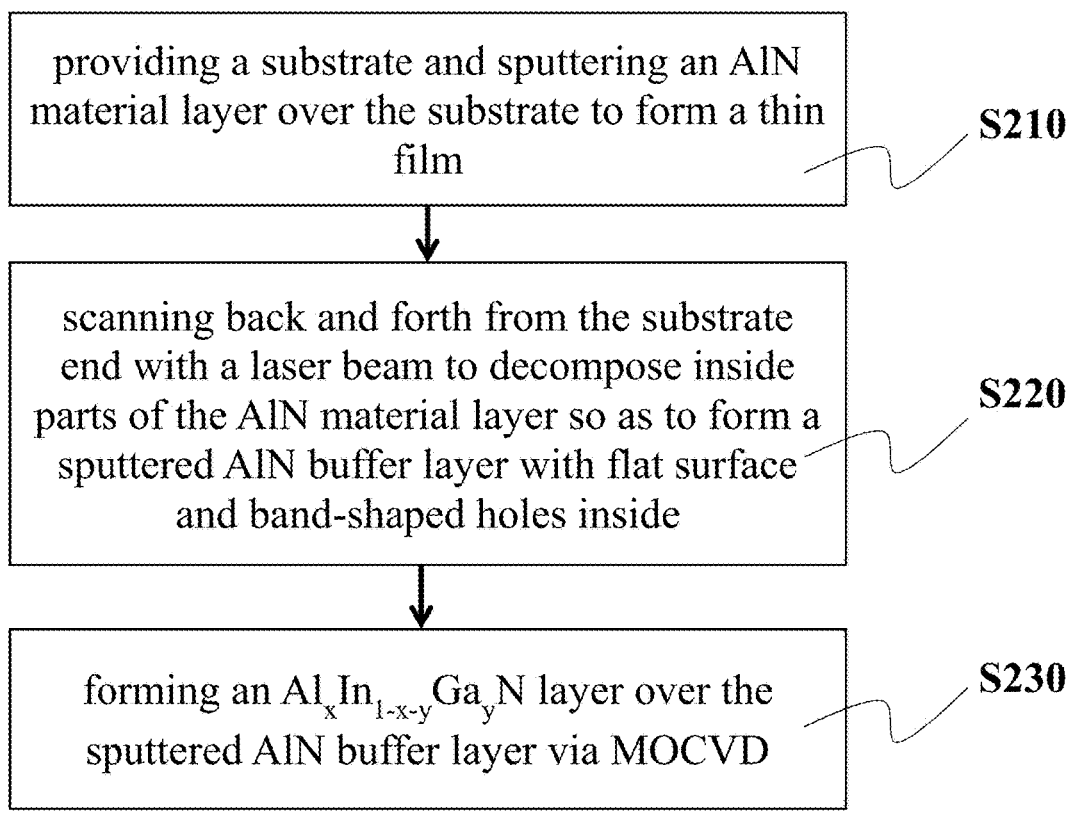
FIG. 9 shows a flow chart for fabricating another nitride underlayer according to some embodiments of the present disclosure.

FIG. 9 shows a flowchart of fabricating another nitride underlayer according to the present disclosure, including steps S210: providing a substrate and sputtering an AlN material layer over the substrate to form a thin film; S220: scanning back and forth from the substrate end with a laser beam to decompose inside parts of the AlN material layer so as to form a sputtered AlN buffer layer with flat surface and band-shaped holes inside; S230: forming an $Al_xIn_{1-x-y}Ga_yN$ layer over the sputtered AlN buffer layer via MOCVD.

More specifically, first, sputter an AlN material layer over the surface of the sapphire plain substrate to form a flat film;

then, scan back and forth from the substrate end with a laser beam to decompose inside parts of the AlN material layer; then, remove the residues generated from decomposing the AlN material layer to form a sputtered AlN buffer layer with flat surface and a band-shaped hole inside; then, form an $Al_XIn_{1-X-Y}Ga_YN$ layer over the sputtered AlN buffer layer via MOCVD. In this embodiment, a laser beam with wavelength of 193 nm and spot diameter of 0.5 mm is adopted to scan this sputtered AlN material layer; therefore, relationship between energy gap E2 of the laser beam and E3 of the AlN buffer layer satisfies E2>E3 so that part of the AlN material layer can be decomposed to obtain a sputtered AlN buffer layer 120 with flat surface and a band-shaped hole inside, wherein, the band-shaped hole is 0.01-0.1 μm deep and about 500 μm wide.

In this embodiment, a laser beam with energy gap larger than that of AlN material is used for scanning, and therefore, the step S110 in Embodiment 1 can be omitted, and some shallower holes are formed.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A nitride underlayer comprising, from bottom up:
a substrate;
a sputtered AlN buffer layer; and
an $Al_XIn_{1-X-Y}Ga_YN$ layer (0≤X≤1, 0≤Y≤1) grown via MOCVD,
wherein the sputtered AlN buffer layer has a flat surface and band-shaped holes therein formed with laser scanning and configured to provide a stress release path to release stress during growth of the $Al_XIn_{1-X-Y}Ga_YN$ layer, and
wherein side walls of the holes and the AlN buffer layer are connected.

2. The nitride underlayer of claim 1, wherein a thickness of the sputtered AlN layer is less than 1 μm.

3. The nitride underlayer of claim 1, wherein the holes have a height of 0.01-0.5 μm.

4. The nitride underlayer of claim 1, wherein the holes have a width of 100-500 μm.

5. A light-emitting diode, comprising, from bottom up:
a substrate;
a sputtered AlN buffer layer;
an $Al_XIn_{1-X-Y}Ga_YN$ layer (0≤X≤1, 0≤Y≤1) grown via MOCVD,
wherein the sputtered AlN buffer layer has a flat surface and band-shaped holes therein formed with laser scanning and configured to provide a stress release path to release stress during growth of the $Al_XIn_{1-X-Y}Ga_YN$ layer, and
wherein side walls of the holes and the AlN buffer layer are connected;
an n-type semiconductor layer;
an active layer; and
a p-type semiconductor layer.

6. The light-emitting diode of claim 5, wherein a light-emitting wavelength of the light-emitting diode is 365 nm-210 nm.

7. The light-emitting diode of claim 5, wherein a thickness of the sputtered AlN layer is less than 1 μm.

8. The light-emitting diode of claim 5, wherein the holes have a width of 100-500 μm.

9. The light-emitting diode of claim 5, wherein the holes have a height of 0.01-0.5 μm.

* * * * *